United States Patent [19]

Boland et al.

[11] Patent Number: 4,870,467
[45] Date of Patent: Sep. 26, 1989

[54] MONOLITHIC TEMPERATURE COMPENSATED VOLTAGE-REFERENCE DIODE AND METHOD OF ITS MANUFACTURE

[75] Inventors: Bernard W. Boland, Scottsdale; William E. Gandy, Jr., Phoenix; Kevin B. Jackson, Scottsdale, all of Ariz.

[73] Assignee: Motorola, Inc., Schaumburg, Ill.

[21] Appl. No.: 752,751

[22] Filed: Aug. 6, 1985

[51] Int. Cl.[4] .................... H01L 29/90; H01L 29/66; H01L 29/00

[52] U.S. Cl. ........................................ 357/13; 357/28; 357/90; 357/33

[58] Field of Search ........................ 357/13, 28, 90, 33

[56] References Cited

U.S. PATENT DOCUMENTS

| | | | |
|---|---|---|---|
| 3,378,915 | 4/1968 | Zenner | 357/13 |
| 3,410,735 | 11/1968 | Hackley | 357/28 |
| 3,497,776 | 2/1970 | Philips | 357/13 |
| 3,519,900 | 7/1970 | Lawrence | 357/13 |
| 3,798,510 | 3/1974 | Erickson et al. | 357/76 |
| 3,953,254 | 4/1976 | Valdman | 357/13 |
| 4,075,649 | 2/1978 | Verderber | 357/13 |
| 4,200,877 | 4/1980 | Suzuki et al. | 357/13 |
| 4,340,900 | 7/1982 | Goronkin | 357/13 |
| 4,349,394 | 9/1982 | Wei | 357/13 |
| 4,398,142 | 8/1983 | Beasom | 323/226 |
| 4,405,932 | 9/1983 | Ishii et al. | 357/28 |
| 4,473,941 | 10/1984 | Turi et al. | 29/578 |
| 4,554,568 | 11/1985 | Champon et al. | 357/13 |

OTHER PUBLICATIONS

Sze, S. M., "Physics of Semiconductor Devices" 2nd Ed., (N.Y., Wiley and Sons) p. 32.

Primary Examiner—Rolf Hille
Assistant Examiner—Robert P. Limanek
Attorney, Agent, or Firm—Jonathan P. Meyer; Raymond J. Warren; Robert M. Handy

[57] ABSTRACT

An improved monolithic, temperature compensated voltage-reference diode is realized by creating a tub of epitaxial semiconductor material in a substrate of opposite conductivity type and creating a voltage reference junction at a surface of the tub. The junction between the tub and the substrate forms the forward-biased, temperature compensating junction of the device. The dopant concentration is varied during growth of the epitaxial material to provide a relatively low resistivity at the voltage-reference junction and a higher resistivity at the temperature compensating junction. The method described offers significant improvement over prior methods of manufacturing such devices in the area of cost and reliability.

13 Claims, 1 Drawing Sheet

MONOLITHIC TEMPERATURE COMPENSATED VOLTAGE-REFERENCE DIODE AND METHOD OF ITS MANUFACTURE

FIELD OF THE INVENTION

The present invention relates, in general, to temperature compensated voltage-reference diodes, which are also referred to as zero temperature coefficient zener diodes. More particularly, the invention relates to a monolithic temperature compensated voltage-reference diode and to a method for its manufacture.

BACKGROUND OF THE INVENTION

Voltage-reference diodes are semiconductor devices which have been widely known and used in the industry for many years. A voltage-reference diode is used in the reverse bias breakdown mode. A voltage-reference is designed so that, once it is in the breakdown mode, the voltage across it is stable over a relatively wide range of currents. It is common practice to refer all voltage-reference diodes as zener diodes, although the later term correctly refers only to a particular type of junction breakdown which may occur in a voltage-reference diode.

A widely recognized problem of voltage-reference diodes is that the breakdown voltage is not stable as the temperature of the junction is varied. An early solution to this problem was to combine a voltage-reference diode with a conventional diode having an equal and opposite temperature coefficient. Typically, the two diodes are separate, discrete devices which are combined in a single package. Such temperature compensated diodes remain a viable product of the semiconductor industry.

There have been attempts to manufacture monolothic, or single chip, temperature compensated voltage-reference diodes. However, these devices have generally involved relatively complex means and/or double sided processing which make them relatively expensive.

SUMMARY OF THE INVENITON

Accordingly, it is an object of the present invention to provide an improved monolothic temperature compensated voltage-reference diode.

It is a further object of the present invention to provide an improved method for manufacturing monolithic temperature compensated voltage-reference diodes which utilizes relatively simple, single-sided processing techniques.

These and other objects and advantages of the present invention are provided by a monolithic, temperature compensated voltage-reference diode comprising: a body of semiconductor material having first and second major faces; a first junction between semiconductor material of different conductivity types formed near said first major surface of said body of semiconductor material, said first junction being capable of functioning as a voltage-reference diode; and a second junction between semiconductor material of different conductivity types, said second junction intersecting said first major face of said body of semiconductor material and surrounding said first junction, said second junction being capable of functioning as a temperature compensating junction. A region of semiconductor material between said first and second junctions has a first resistivity adjacent said first junction and a second resistivity adjacent said second junction. A total impurity concentration is less on the side of the second junction nearest the first junction than on the other side of the second junction.

A method of manufacturing such a device comprises the steps of producing a cavity in a substrate, refilling the cavity with epitaxial material of opposite conductivity type to the substrate having a graded resistivity and forming a junction near the surface of the tub of epitaxial material.

These and other objects and advantages of the present invention will be apparent to one skilled in the art from the detailed description below taken together with the drawings.

DETAILED DESCRIPTION OF THE INVENTION

Figure 1:
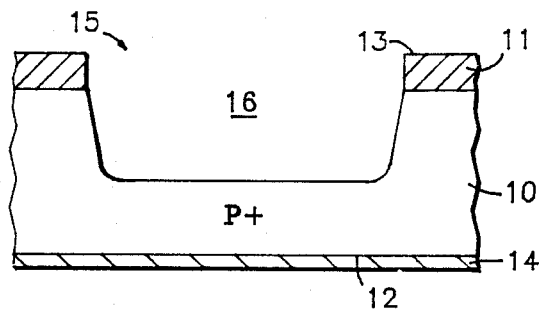
FIG. 1 is a cross-sectional view of a monolithic, temperature compensated voltage-reference diode according to the principles of the present invention at an early intermediate stage in its manufacture.

FIGS. 1-5 illustrate various stages in the manufacture of a monolithic, temperature compensated voltage-reference diode according to a preferred embodiment of the present invention. The preferred embodiment described is a device with a 6.2 volt breakdown rating. FIG. 1 illustrates the device at an early stage of its manufacture after an etch out step. The starting material for the process in the preferred embodiment is a heavily doped P type wafer 10. In particular, the resistivity of wafer 10 may advantageously be in the range of approximately 0.008 to 0.020 ohm-centimeters. This corresponds to a dopant concentration in the range of approximately $1 \times 10^{20}$ to $1.5 \times 10^{18}$ cm$^{-3}$. For future reference, first major surface 11 of wafer 10 will be referred to as the front side and second major surface 12 will be referred to as the backside. In the process steps preceding the stage illustrated in FIG. 1, thermal oxide layers 13 and 14 have been formed on front side 11 and back side 12, respectively.

Thermal oxide layer 13 on front side 11 has been patterned using conventional photolithographic and etch techniques to produce an opening 15. In the preferred embodiment, opening 15 is approximately a square figure which is approximately 15 to 19 mils on a side. Next, wafer 10 is subjected to a conventional anisotropic etch to produce a cavity 16 underlying opening 15 in thermal oxide 13. In the preferred embodiment, the depth of cavity 16 is in the range of approximately 60 to 100 microns.

Figure 2:
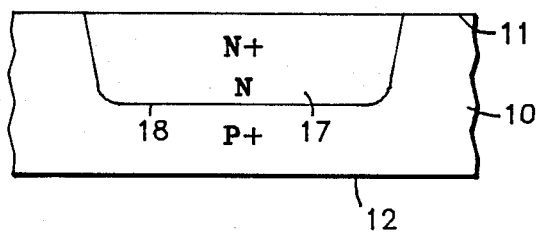
FIG. 2 is a cross-sectional view of the structure of FIG. 1 at a subsequent intermediate stage in its manufacture.

FIG. 2 illustrates the device at a subsequent intermediate stage of processing. The intervening process steps have first stripped thermal oxide layers 13 and 14 (see FIG. 1), formed an epitaxial layer overlying front side 11 of wafer 10 and shaped back front side 11. This leaves a tub 17 of epitaxial material embedded in front side 11 of wafer 10.

The epitaxial layer which now forms tub 17 is doped while being grown by mixing dopant gases with the material which forms the epitaxial layer. As is well known in the art, it is possible to vary the flow rate of dopant gases into the growth chamber during the growth of an epitaxial film to produce a graded dopant concentration over the thickness of the film. This technique is applied in the present invention so that the initial portions of the epitaxial layer are N type material having a resistivity in the range of approximately 0.5 to 1.5 ohm-centimeters and the final portion of the epitaxial layer is more heavily doped N type material having a resistivity in the range of approximately 0.0185 to 0.0200 ohm centimeters. These resistivities correspond to impurity concentrations of approximately $1.5 \times 10^{16}$ to $3.5 \times 10^{15}$ cm$^{-3}$ at the initial stage of the epitaxial growth and approximately $1.7 \times 10^{18}$ to $1.5 \times 10^{18}$ cm$^{-3}$ at the last stage of the growth. The overall thickness of the epitaxial layer is approximately the tub depth plus 20%.

Thus, tub 17 can be seen as comprising two separate regions, the first region is that portion of tub 17 which is adjacent to the P type material of wafer 10. It is this material which forms a first junction 18 which will become the forward biased, temperature compensating junction of the finished device. Towards the center of tub 17 and at front side 11, the second region of tub 17 is the lower resistivity, or more highly doped N type material. It is in this portion of tub 17 that the voltage-reference diode will be fabricated.

The shaping back process used to define tub 17 after the growth of the epitaxial layer is entirely conventional. The surface is first ground and then polished according to standard techniques. Approximately 75 to 125 microns of material are removed. In addition, a brief SIRTL etch is applied to visually delineate tub 17 to facilitate subsequent alignment. Tub 17 ends up with a finished depth in the range of approximately 40 to 70 microns.

Figure 3:
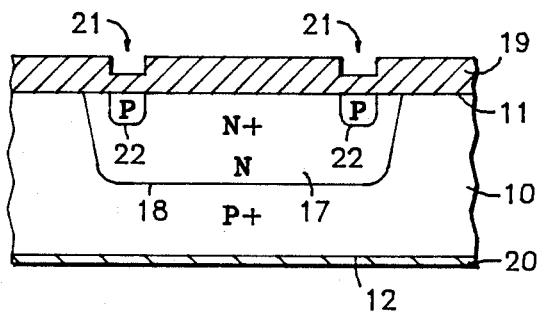
FIG. 3 is a cross-sectional view of the structure of FIGS. 1 and 2 at a subsequent intermediate stage of its manufacture.

FIG. 3 illustrates the device at a subsequent intermediate stage of processing according to the preferred embodiment. Thermal oxide layers 19 and 20 have been formed overlying front side 11 and back side 12, respectively, of wafer 10. Thermal oxide 19 on front side 11 has been patterned according to conventional photolithographic and etch processes to define an opening 21. A P type dopant cource, such as BCl$_3$ is deposited overlying thermal oxide 19 and a dopant redistribution process is performed. In the preferred embodiment this process comprises 10 minutes of N$_2$ with 1% O$_2$, followed by 144 minutes of steam, followed by 144 minutes of dry O$_2$, all carried out at a temperature of 1120° C. This produces a guard ring 22 in tub 17 underlying opening 21. As shown, the dopant redistribution step also produces a thermal oxide layer which closes opening 21. The purpose of guard ring 22 is to ensure that bulk breakdown rather than radius-of-curvature breakdown occurs. The material in tub 17 near front side 11 but at the edges of tub 17 is of the higher resistivity N type material. It is possible to eliminate guard ring 22 in some instances. In the preferred embodiment, guard ring 22 is approximately 2 mils wide and has an inside diameter of approximately 8 mils.

Figure 4:
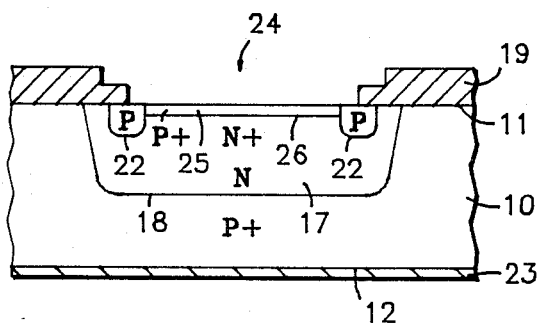
FIG. 4 is a cross-sectional view of the structure of FIGS. 1-3 at a subsequent intermediate stage of its manufacture.

FIG. 4 illustrates the device at a subsequent intermediate stage of processing according to the preferred embodiment. First, the thermal oxide layer on backside 12 of wafer 10 has been removed and replaced with a conventional phosphine getter layer 23. Getter layer 23 is applied for conventional purposes. It is believed that getter layer 23 may be omitted from the manufacturing process in some instances.

Next, an opening 24 is produced in thermal oxide layer 19 overlaying front side 11 by conventional photolithographic and etch processes. The edges of opening 24 approximately coincide with guard ring 22. Next, an ion implantation process is applied to produce a relatively low resistivity P+ type region 25 at the upper surface of tub 17. This creates a second junction 26 which will function as the voltage-reference diode of the finished device.

In the preferred embodiment of the present invention the ion implantation step uses boron ions accelerated to an energy of 80 Kev and implanted to a dose of $1 \times 10^{16}$ per square centimeter. It is possible to insert in the process flow, immediately prior to the ion implantation, the growth of a thin pre-implant oxide to improve the uniformity of region 25. The next step is a rapid anneal to repair crystal damage produced by the ion implantation. Rapid annealing is known in the art as rapid optical annealing, rapid isothermal annealing and other names. In the preferred embodiment the rapid anneal is carried out at a temperature of approximately 1100° C. for a period of approximately 20 seconds. Region 25 is relatively shallow, with a depth of approximately 0.7 microns.

Figure 5:
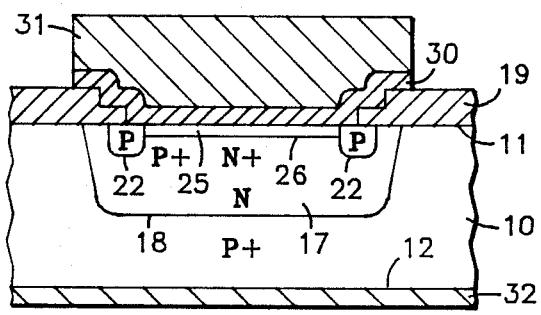
FIG. 5 is a cross-sectional view of a completed monolothic, temperature compensated voltage-reference diode according to the principles of the present invention.

FIG. 5 illustrates the completed device but for the steps of diceing and packaging. The intervening process steps have produced metal layers 30 and 31 on the front side and metal layer 32 on the back side. Metal layer 30 is advantageously a combination of titanium and silver which are evaporated onto the front side in separate stages. Metal layer 31 is advantageously a combination of silver and tin which may be applied by electroplating. Metal layer 32 may advantageously be a composite of titanium, nickel, silver and tin which are evaporated in that order.

These final steps of providing electrical contacts to front side 11 and back side 12 of wafer 10 are widely known in the art and are subject to relatively wide variation.

As will be apparent to one skilled in the art from the foregoing description, an improved monolithic, temperature compensated voltage-reference diode has been disclosed together with an improved method of manufacturing it. The process involves relatively simple, single-sided processes and produces a planar structure. In addition, it is believed that the geometry of this structure offers a potential improvement in impedance over some prior art devices.

The structure and method described produce a monolothic, temperature compensated voltage reference diode at significantly higher yield and lower cost than prior art methods. Significant package problems are avoided through the lack of exposed junctions which must be edge-passivated. The extremely low thickness of the zener, or voltage-reference, junction produces a decrease in the impedance of the device. The "wrap-around" geometry of the temperature compensating junction provides a method of adjusting the area of that junction, and thus the degree of temperature compensation by adjusting depth of the epi tub. Further, an increase in this area does not result in as great an increase in silicon usage as was the case with prior art structures.

While the present invention has been disclosed with reference to a preferred embodiment thereof, various modifications and changes will be apparent to one skilled in the art.

We claim:

1. A monolithic, temperature compensated voltage-reference diode comprising:
   a body of semiconductor material having first and second major faces;
   a first junction between semiconductor material of differnt conductivity types formed near said first major surface of said body of semiconductor material;
   a temperature compensating junction between semiconductor material of different conductivity types, said temperature compensating junction intersecting said first major face of said body of semiconductor material and surrounding said first junction; and
   a portion of said body of semiconductor material lying between said first and temperature compensating junctions having a first resistivity adjacent sadi first junction and a second resistivity adjacent said temperature compensating junction, a total impurity concentration of said semiconductor material being lower on the side of said temperature compensating junction nearest said first junction than on the other side of said temperature compensating junction.

2. A monolothic, temperature compensated voltage-reference diode according to claim 1 further comprising:
   means for making electrical contact to one side of said first junction at said first major surface of said body of semiconductor material; and
   means for making electrical contact to said second major face of said body of semiconductor material.

3. A monolethic, temperature compensated voltage-reference diode comprising:
   a semiconductor substrate of a first conductivity type;
   a tub of semiconductor material in said substrate, a surface of said tub coinciding with a first major surface of said substrate, said tub having a conductivity type opposite to that of said substrate and having a first resistivity adjacent said substrate and a second resistivity adjacent at least a portion of said surface of said tub, said tub and said substrate forming a temperature compensating junction, a total impurity concentration being lower in said tub adjacent said substrate than in said substrate; and
   a region of semiconductor material of said first conductivity type, said region forming at least a portion of said surface of said tub, said region and said tub forming a second junction.

4. A monolithic, temperature compensated voltage-reference diode according to claim 3 further comprising:
   means for making electrical contact to said region of semiconductor material; and
   means for making contact to a second major surface of said semiconductor substrate.

5. A monolithic, temperature compensated voltage-reference diode according to claim 3 wherein:
   said second junction is a voltage-reference diode.

6. A monolothic, temperature compensated voltage-reference diode according to claim 3 further comprising:
   a guard ring of semiconductor material of said first conductivity type, said guard ring having a resistivity higher than said region of semiconductor material and separating said region of semiconductor material from a portion of said tub having said second resistivity.

7. A monolithic, temperature compensated voltage-reference diode according to claim 3 wherein:
   said tub is epitaxial semiconductor material, said first resistivity is in the range of approximately 0.5 to 1.0 ohm-centimeters and said second resistivity is in the range of approximately 0.0185 to 0.0200 ohm-centimeters.

8. A monolithic, temperature compensated voltage-reference diode according to claim 3 wherein:
   said substrate has a resistivity in the range of approximately 0.008 to 0.020 ohm-centimeters.

9. A monolithic, temperature compensated voltage-reference diode according to claim 3 wherein:
   said region of semiconductor material has a depth of approximately 0.7 microns.

10. A monolithic, temperature compensated voltage-reference diode comprising:
    a semiconductor substrate of a first conductivity type, said semiconductor substrate defining an opening therein;
    a first epitaxial layer of a second conductivity type disposed in the opening defined by said semiconductor substrate, said first epitaxial layer defining an opening therein and having a first resistivity;
    a second epitaxial layer of said second conductivity type disposed in the opening defined by said first epitaxial layer, said second epitaxial layer having a surface and a second resistivity, said second resistivity being less than said first resistivity; and
    a region of semiconductor material of said first conductivity type, said region forming at least a portion of said surface of said second eptiaxial layer.

11. The monolithic, temperature compensated voltage-reference diode of claim 10, wherein a junction of said semiconductor substrate and said first epitaxial layer is a temperature-compensating junction.

12. The monolithic, temperature compensated voltage-reference diode of claim 11 wherein a junction of said second epitaxial layer and said region of semiconductor material is a voltage-reference junction.

13. The monolithic, temperature compensated voltage-reference diode of claim 10 wherein further comprising a guard ring of semiconductor material of said first conductivity type, said guard ring having a resistivity higher than said region of semiconductor material and is disposed about a portion of said region of semiconductor material

* * * * *